United States Patent [19]

Koyama

[11] Patent Number: 4,914,304

[45] Date of Patent: Apr. 3, 1990

[54] CHARGED-BEAM EXPOSURE SYSTEM

[75] Inventor: Kiyomi Koyama, Yokohama, Japan

[73] Assignee: Kabushiki Kaisha Toshiba, Kawasaki, Japan

[21] Appl. No.: 394,160

[22] Filed: Aug. 14, 1989

Related U.S. Application Data

[63] Continuation of Ser. No. 114,039, Oct. 29, 1987, abandoned.

[30] Foreign Application Priority Data

Oct. 31, 1986 [JP]  Japan ................................ 61-259709

[51] Int. Cl.$^4$ .......................................... H01J 37/302
[52] U.S. Cl. .............................. 250/492.2; 219/121.25
[58] Field of Search ........................ 250/492.23, 492.2; 219/121.25

[56] References Cited

FOREIGN PATENT DOCUMENTS 56-116621  9/1981  Japan .
60-30131   2/1985  Japan .
61-183926  8/1986  Japan .

OTHER PUBLICATIONS

Thomson et al., J. Vac. Sci. Technol., 15(3), May/Jun. 1978, pp. 891–895.
"Recent Advances in Electron-Beam Lithography for the High-Volume Production of VLSI Devices", IEEE Trans. on Ed., vols. Ed-26, No. 4, Apr. 1979; Hans C. Pfeiffer.

Primary Examiner—Jack I. Berman
Attorney, Agent, or Firm—Oblon, Spivak, McClelland, Maier & Neustadt

[57] ABSTRACT

In an electron beam exposure system, an electron beam emitted from an electron gun is shaped by first and second beam-shaping aperture masks and is projected on a target to draw a predetermined pattern. The predetermined pattern consists of rectangular segment patterns, right-angled triangular segment patterns and predetermined identical segment patterns. Thus, the first aperture mask has a main rectangular aperture and additional predetermined apertures and the second aperture mask has a combination of rectangular and hexagonal apertures which contact each other at one side. The rectangular segment pattern is exposed by the beam passing through the main aperture of the first aperture mask and the rectangular aperture of second aperture and the triangular segment pattern is exposed by the beam passing through the main aperture of the first aperture mask and the triangular aperture of the second aperture mask. The predetermined segment pattern is exposed by the beam passing through the additional aperture of the first aperture mask and the triangular aperture of the second aperture mask.

9 Claims, 6 Drawing Sheets

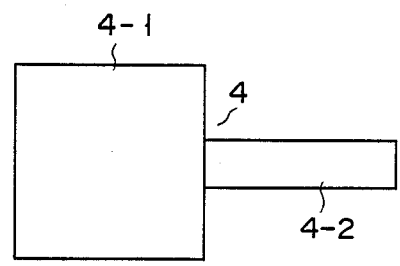
F I G. 1B
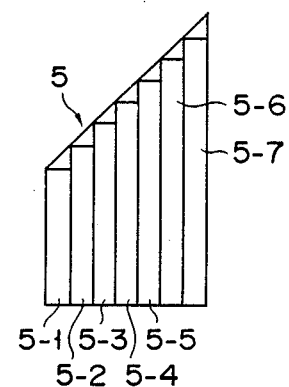
F I G. 2

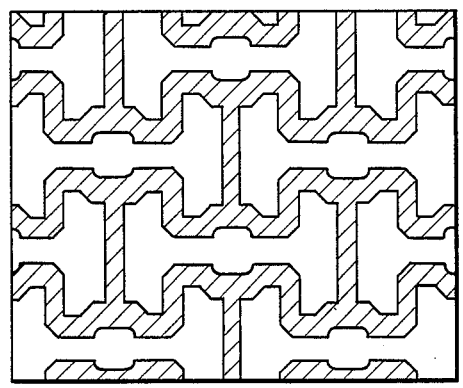
F I G. 4A
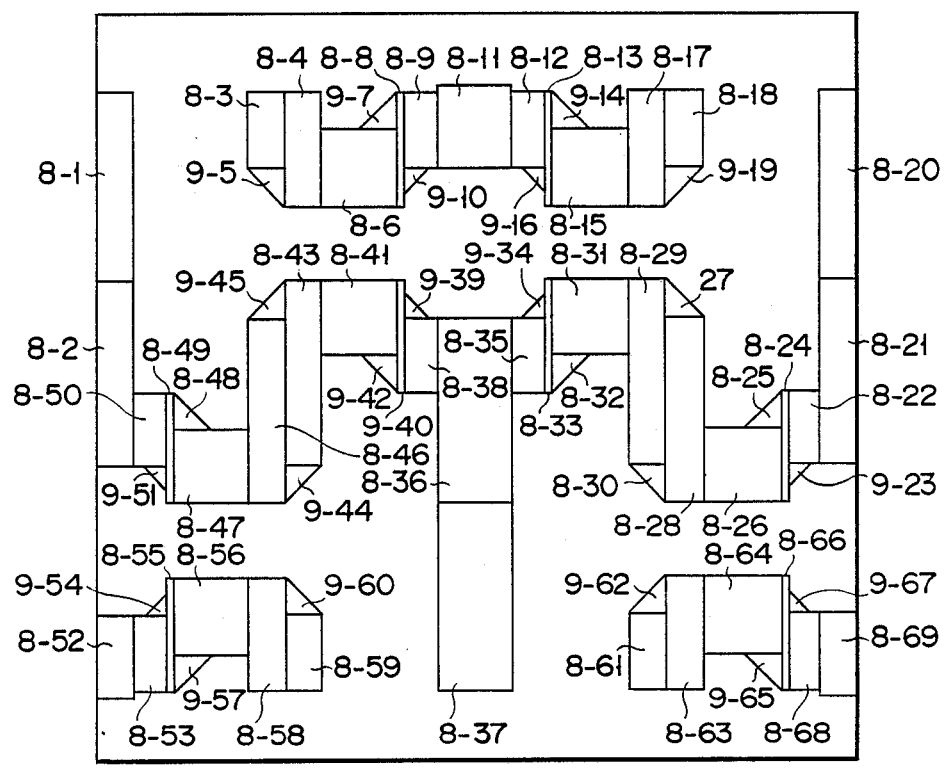
F I G. 4B

CHARGED-BEAM EXPOSURE SYSTEM

This application is a continuation of application Ser. No. 114,039, filed on Oct. 29, 1987, now abandoned.

BACKGROUND OF THE INVENTION

FIELD OF THE INVENTION

The present invention relates to a charged-beam exposure system, and more particularly, to a charged-beam exposure system which can change the cross-sectional shape of a charged-beam and can draw a fine, high-density pattern on a target by applying the charged-beam onto the target.

DISCUSSION OF BACKGROUND

Recently, LSI devices come to gave increasingly fine and complex patterns. Electron beam exposure systems, which apply a electron beam having a variable cross-sectional shape, have been developed for the purpose of forming such fine and complex LSI patterns. Each of these systems has two aperture plates for forming square aperture images 1 and 2, both shown in FIG. 1A. Aperture images 1 and 2 are superposed, thereby forming rectangular aperture image 3, also shown in FIG. 1A. The shape and size of rectangular aperture image 3 can be changed by adjusting the positional relationship between the aperture plates. Hence, when the shape and size of aperture image 3 are selected in accordance with the shape and size of a desired LSI pattern, the LSI pattern can be formed on a target by applying an electron beam having this rectangular aperture image 3, i.e., the selected cross-sectional shape and size, a smaller number of times than otherwise. For example, pattern 4 consisting of two rectangular segments 4-1 and 4-2 as is shown in FIG. 1B can be formed on a target by applying an electron beam having an aperture identical to pattern segment 4-1 and another electron beam having an aperture image identical to pattern segment 4-2. In other words, the pattern shown in FIG. 1B can be drawn on the target by applying an electron beam only twice.

The electron beam exposure system of the type described above has a drawback, however. It cannot draw a pattern having an inclined side, at high speed. To draw pattern 5 shown in FIG. 2, which has an inclined side, thin segments 5-1 to 5-7 having different length are formed on a target. As is evident from FIG. 2, the inclined side of pattern 5, thus formed, is stepped. In order to make this side look straight, more pattern segments less broader than segments 5-1 to 5-7 must be formed on the target. The more pattern segments, the longer it would take to draw pattern 5.

Some electron beam exposure systems, which can draw patterns having inclined sides, at high speed, have been invented, as is disclosed in Japanese Patent Disclosure No. 56-116621 and Japanese Patent Disclosure No. 60-30131. These systems can apply an electron beam which can have a rectangular aperture image and a right-angled triangular aperture image. The system disclosed in Japanese Patent Disclosure No. 60-30131, for example, has two aperture plates, one having rectangular aperture 6 shown in FIG. 3A, and the other having aperture 7 shown in FIG. 3B. Aperture 7 is a combination of a square and a diamond. These apertures 6 and 7 are superposed in various ways as is illustrated in FIG. 3C, thereby forming an electron beam having rectangular aperture image 8 or an electron beam having right-angled triangular aperture image 9. Therefore, pattern 5 having an inclined side can be formed of two rectangular segments 8-1 and 8-2 and two right-angled triangular segments 9-1 and 9-2, as is illustrated in FIG. 3D. Rectangular segments 8-1 and 8-2 are drawn by applying the electron beam having aperture image 8, and right-angled triangular segments 9-1 and 9-2 are drawn by applying the electron beam having aperture image 9. Due to the use of electron beams having different aperture images 8 and 9, a pattern having an inclined side can be drawn on a target, accurately and quickly.

Very recently, the integration density of LSI devices has much more increased, and the LSI patterns of these devices are proportionately complex. Even the electron beam exposure system described in the preceding paragraph cannot draw these complex LSI patterns on targets at a sufficiently high speed.

The memory pattern shown in FIG. 4A consists of rectangular segment patterns 8-1 to 8-69 and right-angled triangular segment patterns 9-1 to 9-67, as is illustrated in FIG. 4B. To draw this complex memory pattern on a target, the target must be exposed to an electron beam 69 times. (Hereinafter, the number of times the target is exposed to an electron beam will be called "the number of shots.") The number of shots, required for forming such memory patterns on one chip, is in the order of $10^8$. The number of shots, required for drawing such memory patterns on one wafer (or one mask), amounts to the order of $10^{10}$. Let us assume that the time necessary for applying an electron beam onto a wafer (hereinafter referred to as "shot time") is 300 nsec, and the number of shots is $10^{10}$. It will then take 50 minutes to draw the memory patterns on the entire wafer, excluding other overhead time. This period of time is too long from an economical point of view. Since the LSI technology is advancing, accompanied by an increase in the integration density of LSI devices, it is expected that a longer period of time is required to draw LSI patterns on one wafer by means of the existing electron beam exposure systems. Particularly, in manufacturing semiconductor memories, a number of identical LSI patterns must be drawn on a wafer, and an enormously long time is required to draw these LIS patterns, which renders it difficult to reduce the cost of the semiconductor memories. This problem is also inherent in an ion beam exposure system which applies an ion beam onto a wafer to draw LSI patterns thereon.

SUMMARY OF THE INVENTION

The object of the present invention is to provide a charged-beam exposure system which can draw a pattern containing many identical segments, on a target at high speed, and which can therefore help to reduce the manufacturing cost of semiconductor devices. According to this invention, there is provided a charged-beam exposure system for applying a charged beam onto a target, thereby to draw a pattern having identical segment patterns, said system comprising: means for emitting a charged beam; an electrooptical system for applying a charged beam onto a target, said electrooptical system having a beam path in which the charged beam passes, and including:

first deflection means arranged along said beam path, for deflecting the charged beam;
first mask means arranged in said beam path, for receiving the charged beam deflected by said first deflection means, and having a first aperture, and an auxiliary aperture located close to the first aperture, for shaping this charged beam;

second deflection means arranged along said beam path, for deflecting the charged beam;

second mask means arranged in said beam path, for receiving the charged beam deflected by said second deflection means, and having a second aperture for shaping this charged beam for shaping the charged beam, and electron lens means for forming the images of the first, second and auxiliary apertures on the target; and drive signal-generating means for generating first and second drive signals for driving said first and second deflection means, said first drive signal driving said first and second deflection means such that the charged beam passes through said first and second apertures, thereby to form a prescribed pattern segment on the target, and said second drive signal driving said first and second deflection mean such that the charged beam passes through said first aperture and said auxiliary aperture, thereby to form the image of said auxiliary aperture on the target as one of said identical pattern segments.

BRIEF DESCRIPTION OF THE DRAWINGS

FIG. 1B is a diagram showing a pattern which can be drawn by superposing the two aperture images shown in FIG. 1A;

FIG. 2 is a diagram showing a pattern having an inclined side;

FIG. 4A shows a relatively complex pattern having many identical pattern segments;

FIG. 4B shows the pattern segments specifically arranged, thus forming the complex pattern illustrated in FIG. 4A;

DETAILED DESCRIPTION OF THE PREFERRED EMBODIMENT

Figure 1A:
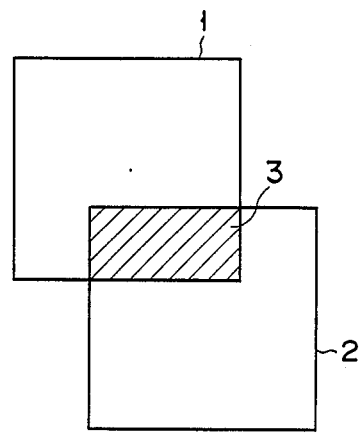
FIG. 1A is a diagram showing two aperture images which are superposed, thereby forming a rectangular aperture image, in a conventional charged-beam exposure system.
Figure 3A:
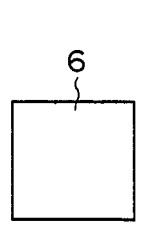
FIGS. 3A and 3B are diagrams showing the apertures cut in the two aperture plates used in another known charged-beam exposure system.
Figure 3B:
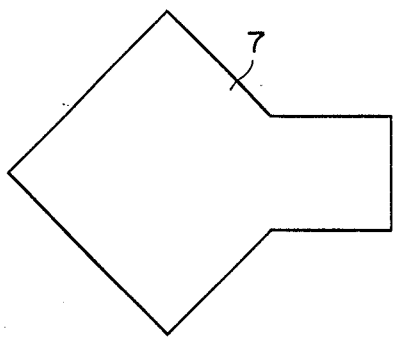
Figure 3C:
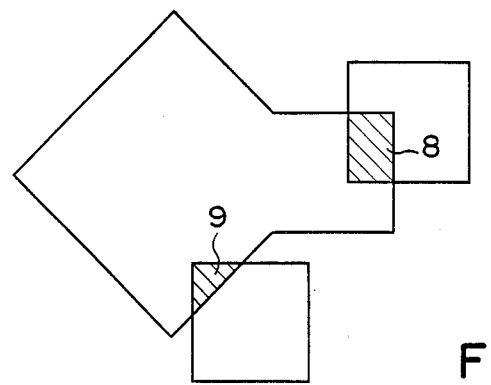
FIG. 3C is a diagram illustrating two aperture images which can be formed by superposing the images of the two apertures shown in FIGS. 3A and 3B.
Figure 3D:
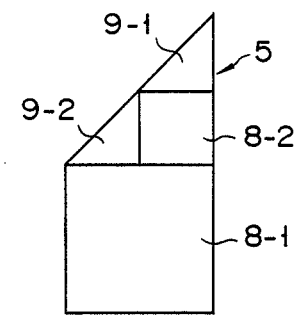
FIG. 3D is a diagram showing a pattern which is a combination of various aperture images which can be formed by superposing the two aperture images illustrated in FIGS. 3A and 3B.
Figure 5:
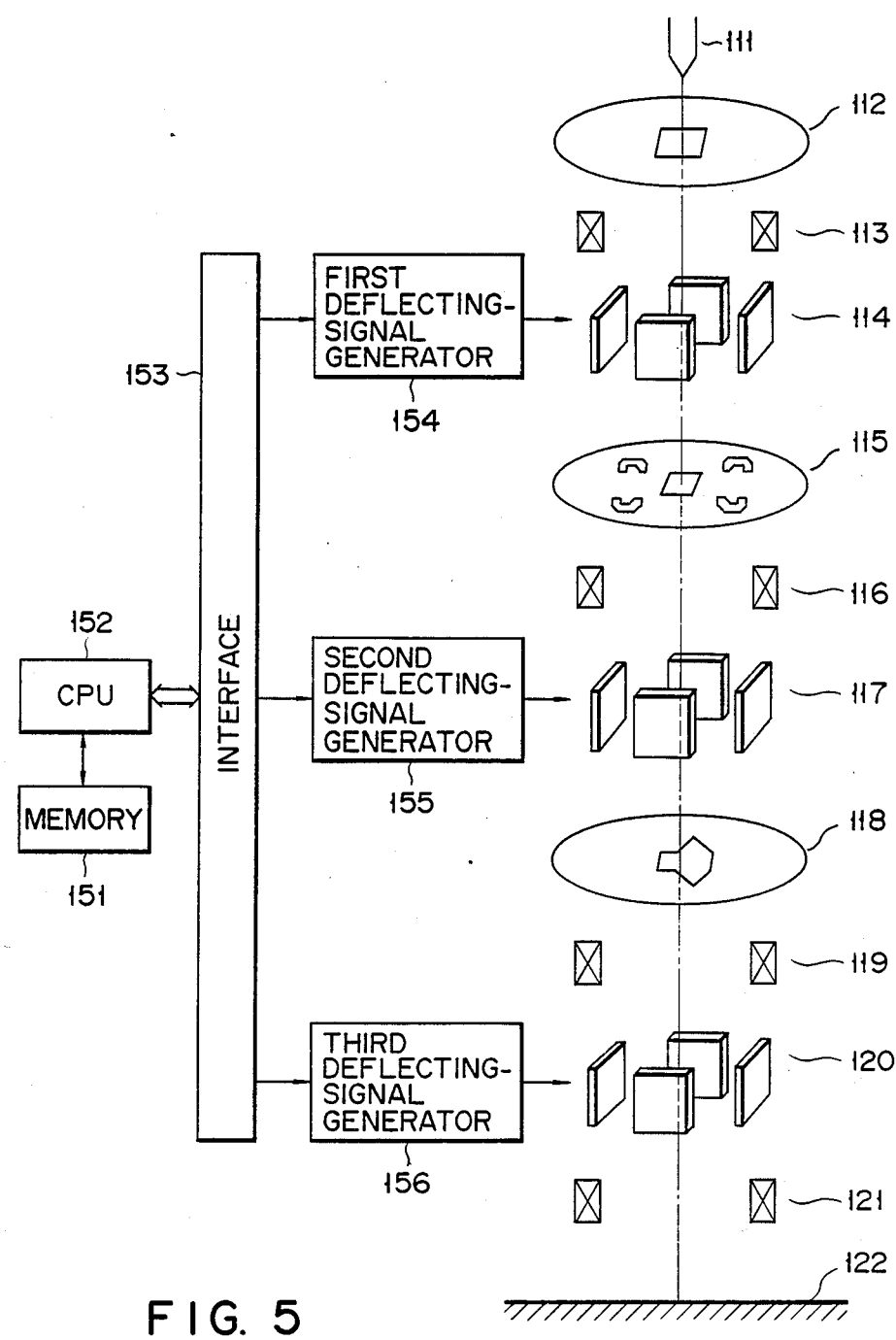
FIG. 5 is a schematical view illustrating an electron beam exposure system according to one embodiment of the present invention.

FIG. 5 schematically shows an electron beam exposure system according to the present invention. This system has an electron-beam exposure section and a control section for controlling the electron beam exposure section. The electron-beam exposure section comprises electron gun 111, beam-controlling aperture mask 112, condenser lens 113, first beam deflector 114, first beam-shaping aperture mask 115, beam-projecting lens 116, second beam deflector 117, second beam-shaping aperture mask 118, beam-focusing lens 119, third beam deflector 120, and objective lens 121. The control section comprises memory 151, CPU connected to memory 151, interface 153 coupled to CPU 152, first deflecting signal generator 154, second deflecting signal generator 155, and third deflecting signal generator 156. The inputs of signal generators 154 155, 156 are connected to interface 153. Their outputs are coupled to first, second and third beam deflectors 114, 117 and 120, respectively.

Figure 6:
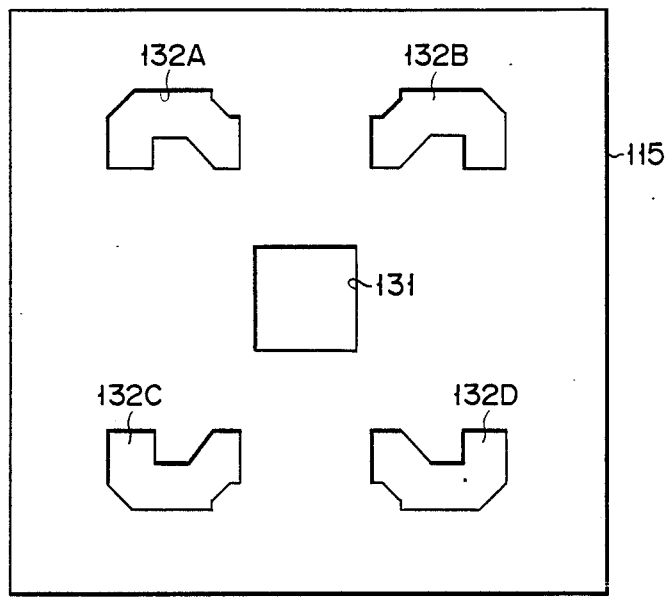
FIG. 6 is a plan view of a first aperture mask used in the system of FIG. 5, and having a main aperture and auxiliary apertures.
Figure 7:
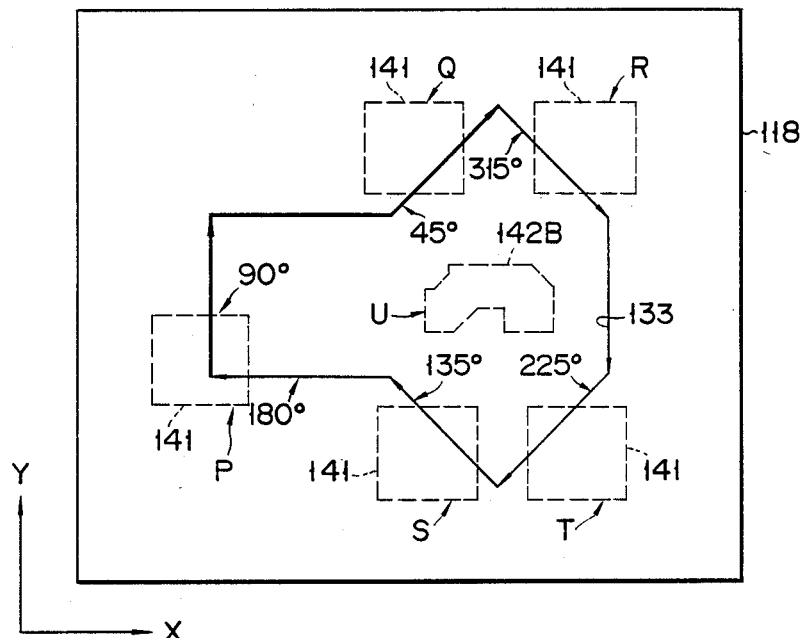
FIG. 7 is a plan view of a second aperture mask used in the system of FIG. 5, and having a polygonal aperture, and illustrating how the image of the polygonal aperture is superposed with the image of the main aperture of the first aperture mask, thereby to form aperture images of various shapes.

In the electron beam exposure section, electron gun 111 emits an electron beam. Beam-controller aperture mask 112 shapes the electron beam such that the beam has a cross section of desired size and shape. The electron beam converges as it passes through condenser lens 113. The beam is then deflected by first beam deflector 114 and applied to main aperture 131 cut in first beam-shaping aperture mask 115, or one of auxiliary apertures 132A to 132D also cut in aperture mask 115 (FIG. 6). The electron beam, which has passed through any aperture of first beam-shaping aperture mask 115, is applied to beam-projecting lens 116. As the beam passes through this lens 116, it converges again. Then, the beam is deflected by second beam deflector 117 such that it is applied onto a desired portion of second beam-shaping aperture mask 118. As is shown in FIG. 7, mask 118 has polygonal aperture 133. The electron beam passes through aperture 133 and is focused by beam-focusing lens 119. The focused beam is deflected by third beam deflector 120 and applied via objective lens 121 onto target 122, e.g., a semiconductor chip or a semiconductor wafer. Target 122 is thus scanned with the electron beam as the beam is deflected by third beam deflector 120 and applied through lens 121. Any desired region of target 122 can thereby be exposed to the electron beam.

As is shown in FIG. 6, main aperture 131 of first beam-shaping aperture mask 115 is rectangular, whereas auxiliary apertures 132A to 132D have complex shapes. When the electron beam is deflected by first beam deflector 114 and passes through main aperture 131, and is further deflected by second beam deflector 117 and applied any side or corner of polygonal aperture 133 of second beam-shaping aperture mask 118 as is shown, in FIG. 7, aperture mask 118 shapes the electron beam into a beam having a rectangular cross section or a right-tangled triangular cross section. In this case, a rectangular pattern segment or a right-angled triangular pattern segment will be formed on target 122. On the other hand, when the electron beam emitted from electron gun 111 is deflected by first beam deflector 114 and passes one of auxiliary apertures 132A to 132D, and is further deflected by second beam deflector 117 and passes through polygonal aperture 133, the beam has a cross section of a shape identical to the auxiliary aperture. If this is the case, one of the pattern segments defined by auxiliary apertures 132A to 132D will be formed on target 122. Further, when the electron beam emitted from gun 111 is deflected by blanking electrodes (not shown), no pattern segments will be formed on target 122.

The electron beam exposure system of FIG. 5 further comprises an axial alignment coil, a focusing correction coil, an astigmatism-reducing coil, a blanking electrodes and the like, though these components are not shown in FIG. 5. Third beam deflector 120 is actually made of a main deflector and an auxiliary deflector, but is illustrated in FIG. 5 as if it were a single-piece device.

Figure 8:
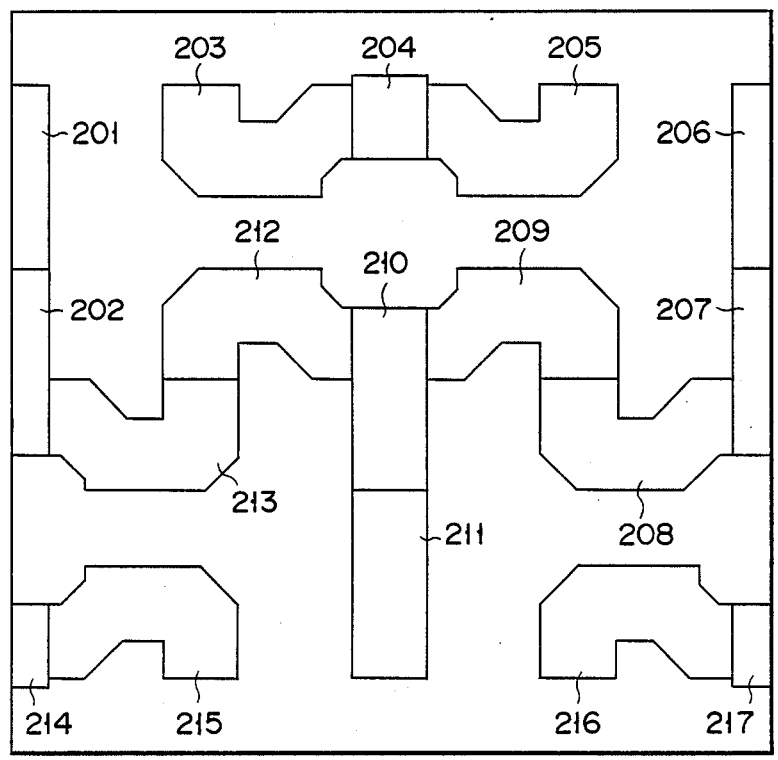
FIG. 8 shows a pattern which are drawn on a target by projecting, onto the target, the various aperture images defined by the auxiliary apertures and formed by superposing the images of the main aperture with the image of the polygonal aperture.

First beam-shaping aperture mask 115 is designed to draw the pattern shown in FIG. 8, in manufacturing a semiconductor memory. As is illustrated in FIG. 6, main aperture 131 is cut in the center portion of this mask 115. Four auxiliary apertures 132A to 132D are cut in the four corner portions of mask 115. The pattern segments defined by auxiliary apertures 132A to 132D are repeated formed on target 122, as is evident from FIG. 8.

Second beam-shaping aperture mask 118 is also designed to draw the pattern of FIG. 8. As is shown in FIG. 7, polygonal aperture 133 is cut in the center portion of mask 118. The polygonal aperture is, so to speak, a combination of a hexagon and a rectangle, and is thus octagonal.

Eight sides of aperture 133, which is octagonal, can be represented as eight vectors with respect to an X-Y coordinate system, these vectors having angles of 0°, 45°, 315°, 270°, 225°, 135°, 180°, and 90°.

When the electron beam, which has passed through main aperture 131 of mask 115, is deflected by second beam deflector 117 and applied at position P on second beam-shaping mask 118, image 141 of main aperture 131 is formed at position P. In this case, mask 118 shapes the beam into one having a rectangular cross section. On the other hand, when the beam is deflected by second beam deflector 117 and applied at position Q, R, S or T on mask 118, aperture image 141 is formed at position Q, R, S or T. In this case, second beam-shaping aperture mask 118 shapes the beam into one having a right-angled triangular cross section. Assume that the electron beam deflected by first beam deflector 114 has passed through auxiliary aperture 132B of mask 115. Then, this electron beam is deflected by second beam deflector 117 such that it passes through polygonal aperture 133, as is represented by U in FIG. 7. Image 142B of the beam, which is shown also in FIG. 7, will therefore be drawn on target 122.

In other words, since the electron beam can be applied through main aperture 131 of mask 115 onto various portions of mask 118, mask 118 change the beam to one having a rectangular cross section of a desired size or a right-angled triangular cross section oriented in a desired direction and having a desired size. Further, since the electron beam can be applied through any auxiliary aperture 132A, 132B, 132C or 132C and through polygonal aperture 133 of mask 118, which is larger than auxiliary apertures 132A to 132D, the image of the auxiliary aperture is formed on target 112, with its shape and sized unchanged at all.

It will now be explained how the pattern of FIG. 8 is drawn on target 122 by means of vector scanning.

Memory 151 stores data representing the pattern. This data is read out from memory 151 and supplied to CPU 152. In accordance with the data, CPU supplies commands to first to third deflecting signal generators 154, 155 and 156. In response to these commands, signal generators 154, 155, 156 generates deflection signals. In order to blank out the electron beam emitted from electron gun 111, a blanking (not shown) signal generator supplies a blanking signal to the blanking electrodes. In response to the blanking signal, the blanking electrodes deflect the beam to blank out the beam.

In order to draw rectangular pattern segment 201 shown in FIG. 8, on target 122, first deflecting signal generator 154 supplies a deflecting signal to first beam deflector 114. Deflector 114 deflects the electron beam such that the beam passes through main aperture 131 of first beam-shaping aperture mask 115. Second deflecting signal generator 155 supplies a deflecting signal to second beam deflector 117. Second beam deflector 117 deflects the beam such that this beam is applied at position P of second beam-shaping aperture mask 118. As a result, mask 118 shapes the beam into one having a cross section whose shape is similar to rectangular pattern segment 201. The electron beam, thus shaped, is deflected by third beam deflector 120, and is applied to a desired portion of target 122. Rectangular pattern segment 201 is thereby formed on target 122. Other rectangular pattern segments 202, 204, 206, 207, 210, 211, 214 and 217, also shown in FIG. 8, are formed on target 122 in the same way as pattern segment 210.

To draw pattern segment 203 which has a specific shape and is to be repeatedly formed, first deflection signal generator 154 supplies a deflecting signal to first beam deflector 114. Deflector 114 deflects the electron beam such that the beam passes through auxiliary aperture 132C of first beam-shaping aperture mask 115. Further, second deflecting signal generator 155 supplies a deflection signal to second beam deflector 117. Second beam deflector 117 deflects the beam such that the beam applied through polygonal aperture 133 of second beam-shaping aperture mask 118. Then, the electron beam is deflected by third beam deflector 120 driven by the deflecting signal supplied from third deflecting signal generator 156. The beam is therefore applied to a desired portion of target 122, thus forming pattern segment 203 thereon. Other pattern segments 205, 208, 209, 212, 213, 215 and 216, which have complex shapes, are formed on target 122 in the same way as pattern segment 203.

Right-angled triangular pattern segments, which are not contained in the pattern shown in FIG. 8, can be drawn on target 122. More specifically, to draw such a pattern segment on a desired portion of target 122, first deflecting signal generator 154 supplies a deflecting signal to first beam deflector 114. In response to this signal, deflector 114 deflects the beam emitted from electron gun 111, such that this beam passes through main aperture 131 of first beam-shaping aperture mask 115. Then, second deflecting signal generator 155 supplies a deflecting signal to second beam deflector 117. Deflector 117 deflects the beam and apply it to position Q, R, S or T of second beamshaping aperture mask 118. As a result, mask 118 shapes the electron beam into one having a cross section whose shape is similar to a right-angled triangle. The beam, thus shaped, is deflected by third beam deflector 120 driven by the deflection signal supplies from third deflecting signal generator 156, and is applied to the desired portion of target 122. A right-angled triangular pattern segment is thereby drawn on that portion of target 122.

In the conventional electron beam exposure system, a target must be exposed to an electron beam eight times in order to draw, for example, complex pattern segment 203 shown in FIG. 8. Only one shot suffices to draw this pattern segment 203 on target 122 in the electron beam exposure system according to the present invention. To draw the entire memory pattern of FIG. 4B, which is identical to the pattern of FIG. 8, 69 shots are required in the conventional system, whereas only 17 shots are needed in the system of the present invention as can be understood from FIG. 8. In other words, the number of shots required to draw the pattern of FIG. 4B can be reduced to about a quarter, as compared with the conventional electron exposure system.

The embodiment of the invention, described above, can shape an electron beam into not only a beam having a rectangular or triangular cross section, but also a beam having a cross section whose shape is complex and similar to that of a pattern segment repeatedly appearing in an LSI pattern. Thus, when the embodiment of the invention is used, a complex segment can be drawn by a single shot of an electron beam, and the speed of drawing the LSI pattern on a target can be greatly increased. The embodiment can, therefore, increase the LSI pattern-drawing speed very much, particularly the LSI pattern contains many identical pattern segments which occupy 80 to 90% of all segments forming the pattern, as in the case of a semiconductor memory pattern.

In order to draw an LSI pattern containing many different kinds of identical segments, it would be sufficient to prepare a few aperture masks and use these masks one after another. In this case, too, the LSI pattern can be drawn on a target within a period of time far shorter than is required in the conventional electron beam exposure system. The above embodiment can therefore be very useful in manufacturing semiconductor devices.

Further, with the system of the invention, it suffices to control the voltage applied to first beam deflector 114 in order to select one of the auxiliary apertures cut in first beam-shaping aperture mask 115. There is no need to change the operation condition of any component of the electron-beam exposure section. Therefore, the present invention can be reduced to practice merely by adding first deflecting signal generator 154 and first beam deflector 114 to the conventional electron beam exposure system and by cutting some auxiliary apertures in the first aperture plate used in the conventional electron beam exposure system.

The present invention is not limited to the embodiment described above. For instance, the number of the auxiliary apertures cut in first beam-shaping aperture mask 115 can be less or greater than 4. That is, as many auxiliary apertures can be made in mask 115. Further, each auxiliary aperture need not have a shape identical to that of a pattern segment repeatedly appearing in an LSI pattern; its shape can be identical to that of one of the sub-segments forming of that pattern segment. Still further, polygonal aperture 133 of second beam-shaping aperture mask 118 need not be the polygonal one shown in FIG. 7. Aperture 133 can have any other polygonal shape which can serve to shape the beam, which has passed through main aperture 131 of mask 115, into one having a rectangular or right-angled angular cross section. When no beams having a triangular cross section are required, aperture 133 can be a rectangular one.

Moreover, first and second beam-shaping aperture masks 115 and 118 can take each other's position. In this case, first beam deflector 114 is located below mask 118, and second beam deflector 117 is positioned right above mask 118 and further above first beam deflector 114. First and second deflecting signal generators 154 and 155 can be combined into a single unit.

The embodiment described above is an electron beam exposure system. Nonetheless, the present invention can be applied to an ion beam exposure system.

Furthermore, various changes and modification may be made without departing from the spirit and scope of the present invention.

As has been explained, the charged beam exposure system of this invention can shape a charged beam into one having a cross section identical in shape to a relatively simple pattern segment or a relatively complex pattern segment repeated appearing in an LSI pattern. The system can, therefore, reduce the number of shots required in drawing the LSI pattern on a target, particularly when the LSI pattern contains many identical pattern segments. Hence, the system can draw the LSI pattern at high speed, thereby reducing the manufacturing cost of LSI devices.

What is claimed is:

1. A charged-beam vector scanning exposure system for applying a charged beam onto a target, thereby to draw a pattern having identical segment patterns wherein each of said segment patterns are exposed at a predetermined location on said target, said system comprising:

beam-emitting means for emitting a charge beam;

an electrooptical system for applying a charged beam onto a target, said electrooptical system having a beam path in which the charged beam passes, and including:

first deflection means arranged along said beam path, for deflecting the charged beam;

first mask means arranged in said beam path, for receiving the charged beam deflected by said first deflection means, and having a first aperture, and at least one auxiliary aperture located close to said first aperture, for shaping said charged beam;

second deflection means arranged along said beam path for deflecting the charged beam;

second mask means arranged in said beam path, for receiving the charged beam deflected by said second deflection means, and having a second aperture for shaping said charged beam wherein said second aperture is larger than any one of said at least one auxiliary aperture so that a beam passing through any one of said at least one auxiliary aperture is not shaped by said second aperture; and electron lens means for forming the images of the first, second and auxiliary apertures on the target; and drive signal-generating means for generating first and second drive signals for driving said first and second deflection means, said first drive signal driving said first and second deflection means such that the charged beam passes through said first and second apertures, whereby the image of said first and second apertures are super posed to thereby form a prescribed pattern segment on the target, and said second drive signal driving said first and second deflection means such that charged beam passes through said auxiliary aperture and said second aperture, thereby to form the image of said auxiliary aperture on the target as one of said identical pattern segments.

2. The system according to claim 1, wherein said second deflection means is located between the target and said first deflection means, said first mask means is located between said second deflection means and the target, and said second mask means is located between said first deflection means and said second deflection means.

3. The system according to claim 1, wherein said first mask means further has a second auxiliary aperture located close to said first aperture, the image of said second auxiliary aperture is formed on the target by means of said electron lens means, and said first and second deflection means deflect the charged beam in response to a third drive signal, such that the charged beam passes through said second aperture and said second auxiliary aperture, whereby the image of said second auxiliary aperture is formed on the target as one of said identical pattern segments.

4. The system according to claim 3, wherein said first mask means further has a third auxiliary aperture located close to said first aperture, the image of said third auxiliary aperture is formed on the target by means of said electron lens means, and said first and second deflection means deflect the charged beam in response to a fourth drive signal, such that the charged beam passes through said second aperture and said third auxiliary aperture, whereby the image of said third auxiliary aperture is formed on the target as one of said identical pattern segments.

5. The system according to claim 4, wherein said first mask means further has a fourth auxiliary aperture located close to said second aperture, the image of said fourth auxiliary aperture is formed on the target by means of said electron lens means, and said first and second deflection means deflect the charged beam in response to a fifth drive signal, such that the charged beam passes through said second aperture and said fourth auxiliary aperture, whereby the image of said fourth auxiliary aperture is formed on the target as one of said identical pattern segments.

6. The system according to claim 1, wherein said second aperture is a combination of a rectangular aperture and a hexagonal aperture, which contact each other at one side.

7. The system according to claim 1, wherein said second aperture is rectangular.

8. The system according to claim 1, wherein said electrooptical system further has third mask means for restricting and guiding the charged beam from said beam-emitting means to said second mask means.

9. The system according to claim 1, wherein said first deflection means is located between the target and said second deflection means, said first mask means is located between said first deflection means and the target, and said second mask means is located between said second deflection means and said first deflection means.

* * * * *